(12) United States Patent
Tews

(10) Patent No.: US 7,405,127 B2
(45) Date of Patent: Jul. 29, 2008

(54) METHOD FOR PRODUCING A VERTICAL FIELD EFFECT TRANSISTOR

(75) Inventor: Helmut Tews, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/414,478

(22) Filed: Apr. 28, 2006

(65) Prior Publication Data

US 2007/0004149 A1  Jan. 4, 2007

Related U.S. Application Data

(63) Continuation of application No. PCT/EP2004/052485, filed on Oct. 8, 2004.

(30) Foreign Application Priority Data

Oct. 30, 2003  (DE) ................. 103 50 751

(51) Int. Cl.
*H01L 21/336* (2006.01)

(52) U.S. Cl. ............ 438/268; 438/200; 438/253; 438/283; 257/E21.41; 257/E21.442

(58) Field of Classification Search ............ None
See application file for complete search history.

(56) References Cited

U.S. PATENT DOCUMENTS

| | | | |
|---|---|---|---|
| 6,197,641 | B1 | 3/2001 | Hergenrother et al. |
| 6,303,425 | B1 | 10/2001 | Maeda et al. |
| 6,433,382 | B1 | 8/2002 | Orlowski et al. |
| 2002/0057610 | A1* | 5/2002 | Baliga ............... 365/200 |
| 2002/0140032 | A1 | 10/2002 | Cho et al. |
| 2002/0177265 | A1 | 11/2002 | Skotnicki et al. |
| 2002/0195649 | A1 | 12/2002 | Noble et al. |

FOREIGN PATENT DOCUMENTS

| | | |
|---|---|---|
| DE | 196 21 244 A1 | 11/1996 |
| DE | 198 46 063 A1 | 4/2000 |
| DE | 199 24 571 C2 | 3/2001 |
| FR | 2 823 009 | 10/2002 |

\* cited by examiner

*Primary Examiner*—Michael S. Lebentritt
*Assistant Examiner*—Kyoung Lee
(74) *Attorney, Agent, or Firm*—Brinks Hofer Gilson & Lione

(57) ABSTRACT

A method for producing a field effect transistor, in which a plurality of layers are in each case deposited, planarized and etched back, in particular a gate electrode layer, is disclosed. This method allows the manufacturing of transistors having outstanding electrical properties and having outstanding reproducibility.

10 Claims, 3 Drawing Sheets

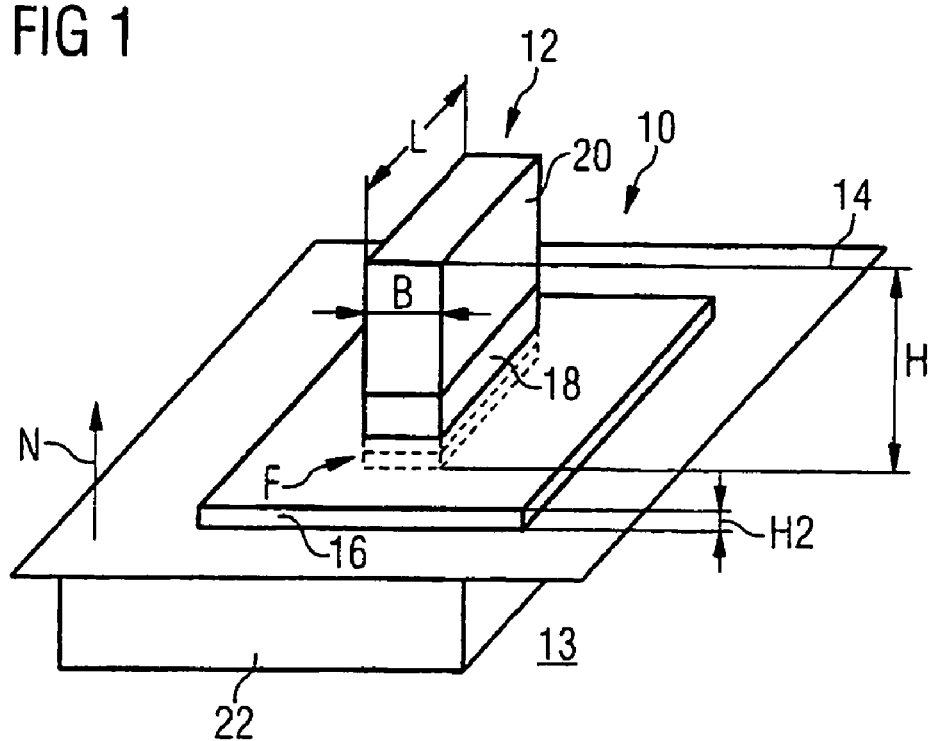
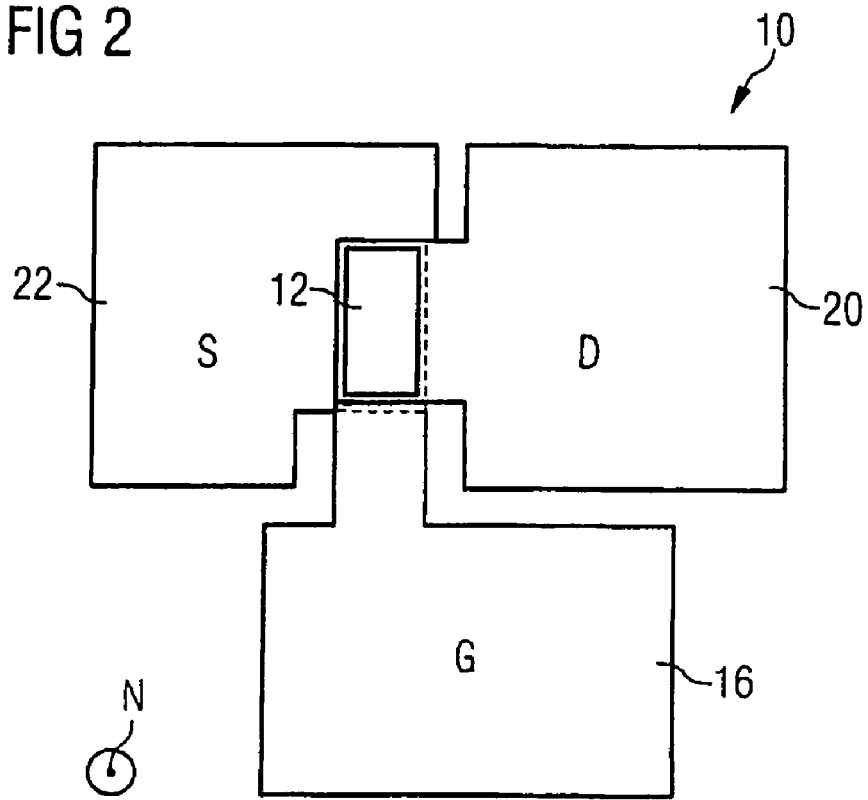

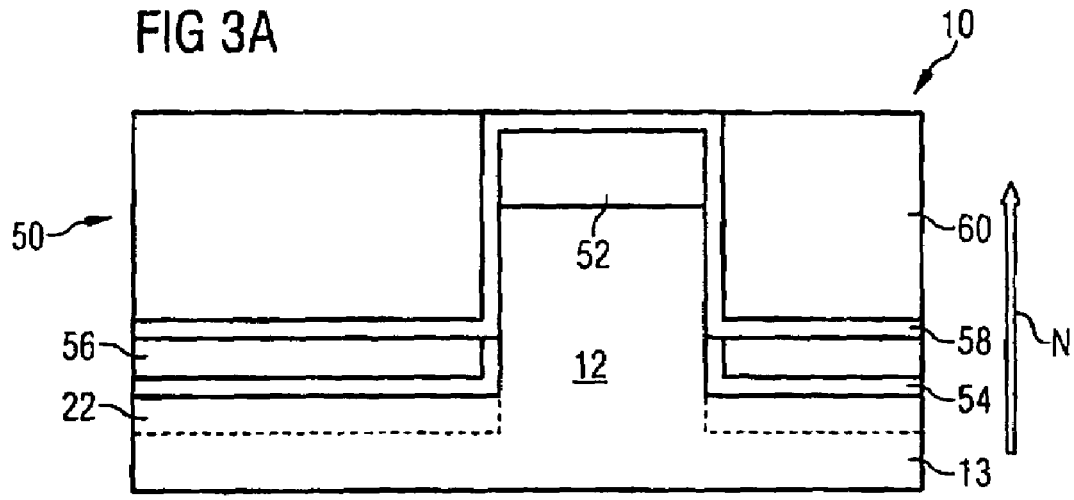
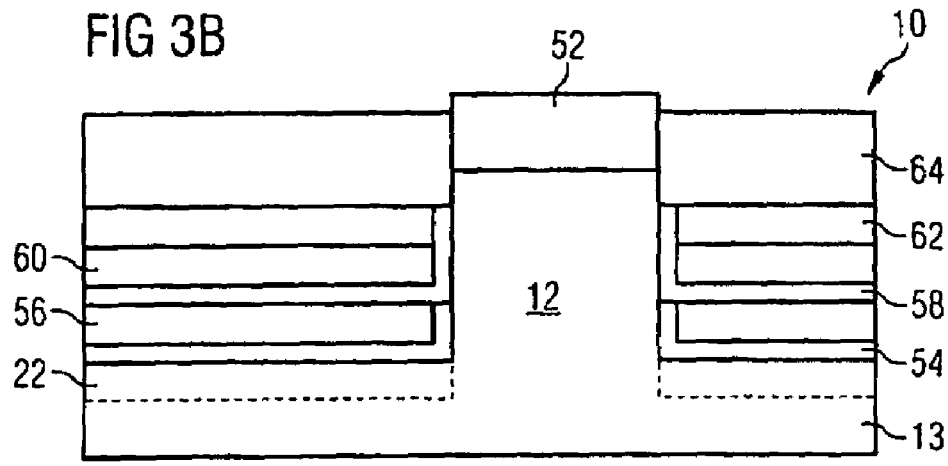
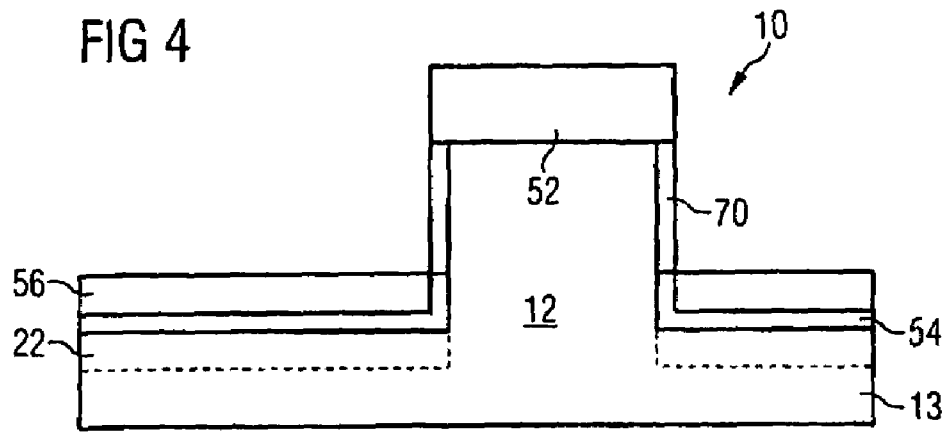

METHOD FOR PRODUCING A VERTICAL FIELD EFFECT TRANSISTOR

CROSS REFERENCE TO RELATED APPLICATIONS

This application is a continuation of international application PCT/EP2004/052485, filed Oct. 8, 2004, which claims priority to German patent application serial number DE 10350751.5, filed Oct. 30, 2003.

BACKGROUND

1. Field of the Invention

The invention relates to a method for producing a vertical field effect transistor.

2. Description of the Related Art

The field effect principle consists in influencing the current flow in a channel by means of the potential at a control electrode. The control electrode is also referred to as the gate. The field effect transistors for logic circuits are intended to have a short gate length, a thin gate dielectric and, at the same time, a large switch-on current. Moreover, the operating voltage is intended to be as small as possible in order to avoid excessively large leakage currents through the thin gate dielectric. Conventional planar field effect transistors cannot meet these requirements.

For example, the German patent specification DE 199 24 571 C2 discloses a double gate structure that enables a high switch-on current because two gates contribute to the current control. The operating voltage can be reduced for this reason. Dual or even triple gate structures are a promising approach for improving the electrical properties of a field effect transistor, particularly at ultrashort gate lengths, that is to say gate lengths of less than 100 nanometers.

However, multiple gate structures have drawbacks. For example multiple gate structures are three-dimensional structures, so that their production is difficult and must be carefully optimized. Despite the small dimensions, the area requirement of chip area per transistor is also still intended to be as small as possible. Moreover, the transistors are intended to have electrical properties like silicon on insulator (SOI) wafers.

Accordingly, there exists a need for a field effect transistor that avoids excessively large leakage currents through the thin gate dielectric in a small package.

SUMMARY

The invention provides a simple method for producing a field effect transistor having very good electrical properties. Moreover, the intention is to specify a field effect transistor having very good electrical properties that is simple to produce, in particular a FLASH memory transistor.

In another embodiment of the invention, the additional steps of planarization of the control electrode layer, and whole-area etching-back of the planarized control electrode layer are performed.

The above steps are simple to perform and have the consequence that the control electrode can be produced in particular with a rectangular or square cross section. In particular, the width of the control electrode remains the same with increasing distance from the substrate. Tapering sections can be avoided at the control electrode. The control electrode can therefore be produced in a very dimensionally accurate manner and with high positioning accuracy with regard to the projection. Therefore, field effect transistors are produced with mutually identical and particularly good electrical properties.

The whole-area etching-back is preferably carried out anisotropically. Given a suitable choice of materials, however, it is also possible for an isotropic etching-back step to be performed.

The production method according to the invention is used in particular in the production of so-called vertical transistors, which have only a small area requirement.

In yet another embodiment, the gate electrode remains along a complete circulation around the projection after the conclusion of the whole-area etching-back. The layout of a FinFET is thus rotated through 90 degrees, so that the fin lies vertically with respect to a wafer surface. If the fin has a square or rectangular cross section parallel to the surface of the chip or wafer, then four control electrodes protrude from the four sidewalls of the gate. The control electrodes enclosing the projection lead to a particularly high switch-on current. Given a minimal dimensioning of the projection e.g. with a side length of less than 50 nanometers, during operation of the field effect transistor a substrate region depleted of charge carriers arises as in the case of an SOI substrate, but without an expensive SOI substrate being required.

The height of the projection is to be dimensioned such that the thinnest possible gate electrode and the adjacent spacer layers for insulating the gate electrode located toward the source and drain, stacked one above another, are smaller than the height of the projection. Space for a connection electrode, in particular for the source contact, may also determine the height.

In another embodiment, a part of the structure or a part of an insulating layer covering the structure is uncovered during the etching-back of the planarized control electrode layer, so that this part is accessible for further processing steps and for the arrangement of further elements.

In another development, prior to the application of the control electrode layer, the spacer layer near to the substrate is planarized and etched back over the whole area, preferably a part of the structure being uncovered. As an alternative the spacer layer near to the substrate can also be applied such that it is only very thin, with the result that etching-back is not necessary. However, etching-back leads to a very dimensionally accurate spacer layer.

In a another embodiment, after the etching-back of the control electrode layer, an electrically insulating spacer layer remote from the substrate is applied, planarized and etched back over the whole area. In particular the repeated planarization and etching-back in the case of successively applied layers make it possible to achieve a dimensionally accurate three-dimensional integration.

In yet another embodiment, the thickness of the lower spacer layer is not equal to the thickness of the upper spacer layer. This has advantages in the optimization of the transistors. Different thicknesses are not simple to realize in a normal CMOS flow.

In another embodiment, after the application of the spacer layer remote from the substrate, a connection electrode layer is applied, preferably a source layer. The source layer preferably covers the sidewalls of the projection, so that the contact area is enlarged. In one refinement, the connection electrode layer is additionally planarized, so that it can subsequently be patterned without any problems.

In yet another embodiment of the method according to the invention, the spacer layer near to the substrate, the control electrode layer and the spacer layer remote from the substrate and also the connection electrode layer are patterned jointly, e.g. by means of a photolithographic method or by means of a spacer technique. The number of production steps are few in number as a result.

In another embodiment, an electrically insulating layer is applied as gate dielectric on a part of the structure after the etching-back of the spacer layer near to the substrate and prior to the application of the control electrode layer, in particular by a whole-area layer deposition, for example of a material having a relative permittivity of greater than 4 or greater than 8, or by thermal growth, for example a thermal oxidation.

In yet another embodiment, the structure is formed with the aid of a hard mask, the hard mask being used as a stop layer during all the planarization steps mentioned. It is thus possible to stop very accurately at a predetermined level. Proceeding from this level, it is then possible to perform a time-controlled etching-back process during which it is possible to produce an etched-back layer having a layer thickness in a small tolerance range.

In another embodiment, a charge storage layer is applied after the application of the spacer layer near to the substrate and prior to the application of the control electrode layer. The charge storage layer is patterned prior to the application of the control electrode layer. The charge storage layer is electrically conductive, e.g. metallic, semiconducting or electrically insulating. In the case of an electrically insulating charge storage layer, the charges are introduced in particular with the aid of tunneling currents. The development gives rise to e.g. an EEPROM (Electrically Erasable Programmable Read Only Memory) cell, which can be erased independently of adjacent cells, or a flash EPROM cell, which can only be erased jointly with adjacent cells.

In another embodiment, "buried" bit lines produced by substrate dopings are used in the memory unit. The memory unit is organized e.g. as a NOR type or as an SNOR. Tunneling currents, in particular Fowler-Nordheim tunneling currents (FN), are used for erasure. Tunneling currents or hot charge carriers (CHE—Channel Hot Electron) are used for programming. The dimensionally accurate fabrication on account of the single or multiple planarization and etching-back leads to outstanding electrical properties of the memory cell, in particular with regard to the programming reliability, the number of programming cycles and with regard to the shift in the threshold voltage.

In another embodiment, the charge storage layer is planarized and subsequently etched back over the whole area, preferably a part of the structure or a part of the insulating layer being uncovered. By means of these steps, it is possible to produce a charge storage layer with a top area that lies parallel to a substrate layer or to the base area. Such a charge storage layer leads to defined programming and erasure operations. In one development, at least one spacer element is formed on the structure and on the charge storage layer. The spacer element then serves for the patterning of the charge storage layer, so that a simple self-aligning spacer technique is used for patterning.

The invention additionally relates to a vertical field effect transistor whose control electrode has a planar interface remote from the substrate, said interface lying parallel to a base area of the projection that is near to the substrate. In one embodiment, the control electrode is delimited by the planar interface everywhere in the direction of the normal to the base area, which points away from the substrate. Expressed in different words, "upwardly" there are no inclined interfaces or upwardly tapering projections which would make the electrical properties of the transistor less controllable.

In another embodiment, the field effect transistor has at least one charge storage region arranged between an insulating region and a control electrode region, having a planar interface remote from the substrate, said interface lying parallel to the base area of the projection. This gives rise to a memory transistor having defined and well-controllable electrical properties. In one embodiment, the field effect transistor is formed as a sidewall transistor or as a so-called surrounded gate transistor.

In particular, the field effect transistors have been produced by the method according to the invention or one of its developments, so that the technical effects mentioned above are applicable.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 1 shows a simplified illustration of a sidewall field effect transistor;

FIG. 2 shows a plan view of the field effect transistor;

FIGS. 3A and 3B show production stages in the production of the field effect transistor;

FIG. 4 shows an alternative production stage in the production of the field effect transistor.

DETAILED DESCRIPTION

Figure 5A:
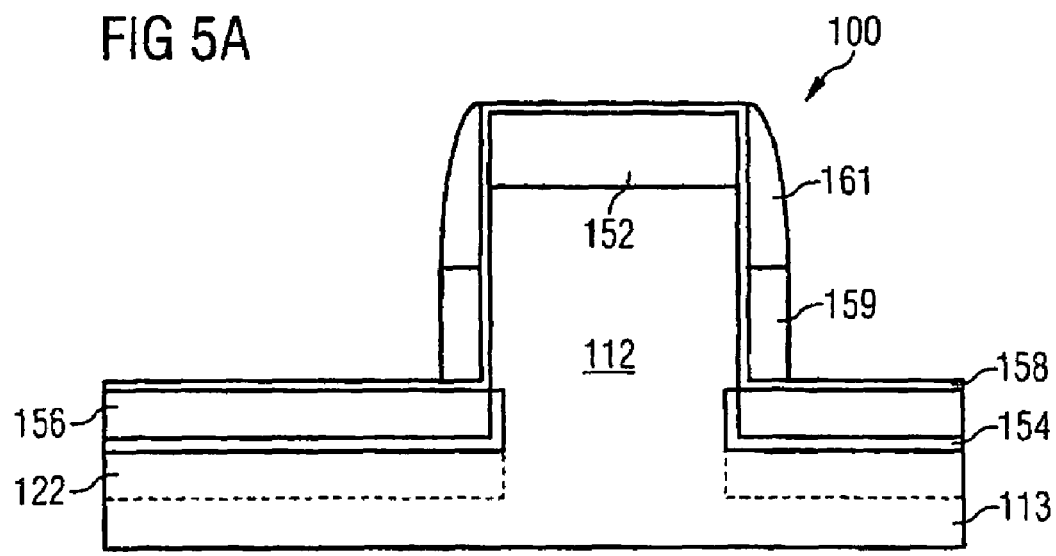
FIGS. 5A and 5B show production stages in the production of a sidewall flash field effect transistor.

FIG. 1 shows a vertical fin field effect transistor 10 formed on a fin 12. The fin 12 has been etched from a semiconductor substrate 13, which has a planar substrate surface 14 after etching. By way of example, a silicon substrate which is initially predoped or undoped is used. The fin 12 may have a height H of 100 nanometers in the direction of the normal N to the substrate surface 14. The width B of the fin 12 is e.g. 20 nanometers. The length L of the fin 12 is e.g. 60 nanometers.

At the foot F of the fin 12 or at the base of the fin 12, a base area of the fin 12 is situated in the plane of the substrate surface 14. A gate electrode 16 encloses the fin 12 and lies parallel to and at a distance from the substrate surface 14. The distance may be 30 nanometers. The gate electrode 16 comprises doped polycrystalline silicon.

A gate dielectric 18 (not illustrated in FIG. 1) is situated between the gate electrode 16 and the fin 12. Suitable gate dielectrics are silicon dioxide or insulating materials having a relative permittivity of greater than 3.9 or greater than 7, such as high-k materials.

A drain region 20 is arranged in the upper part of the fin 12. The drain region is n-doped in the case of an n-channel transistor and p-doped in the case of a p-channel transistor. Around the base area at the foot F of the fin 12, a source region 22 is arranged in the substrate 13 directly beneath or adjoining the substrate surface 14. The source region having the same doping as the drain region 20. In another exemplary embodiment, the source region is arranged in the fin 12 and the drain region is arranged in the substrate. In another exemplary embodiment, the doping of the source and the doping of the drain are different in order to permit good optimization of the transistors. The height H of the fin 12 is determined by the height of two spacer elements for insulating the gate electrode 16 from the substrate surface 14 and from a drain connection, respectively, by the height H2 of the gate electrode and by the height of a drain connection.

FIG. 2 shows a plan view of the field effect transistor 10 with an area S for the source region 22 or for a source connection region, with an area G for the gate electrode or for a gate electrode connection region, and with an area D for the drain region or for a drain connection region. The connection regions are square or rectangular and lie on different sides of the fin 12. The drain connection region D also encloses the fin 12. The field effect transistor 10 is thus a vertical field effect transistor having four control electrodes or gate regions and having a small structural height.

FIG. 3A shows a production stage in the production of the field effect transistor 10. Proceeding from the substrate 13, shallow isolation trenches (not illustrated) are produced, which serve for isolating transistors from each one another. The isolation trenches are filled in a known manner with an insulating material, such as silicon dioxide. After filling, planarization is effected, e.g. by means of a chemical mechanical polishing method CMP.

After planarization, a hard mask layer 50, such as, a silicon nitride layer is deposited. The hard mask layer 50 is patterned with the aid of a photolithographic method or with the aid of a spacer technique. A hard mask 52 remaining in the region of the transistor 10. Further hard mask sections remain at other locations of the substrate 13 for the purpose of producing a multiplicity of other transistors. The transistors are produced by means of the same method steps described and are therefore constructed identically. The hard mask 52 has, for example, the abovementioned dimensions of 20 nanometers by 60 nanometers.

After the patterning of the hard mask layer 50, the substrate 13 is patterned in accordance with the hard mask by means of the same etching method previously described, producing the fin in the process. Etching is effected in a time-controlled manner by means of a known etching method. If appropriate, the hard mask layer is also thinned during etching. After the production of the fin, the hard mask layer 50 may have a thickness of 40 nanometers.

A thin screen oxide layer 54 is subsequently produced in order to protect the substrate during the source implantation steps that follow. The oxide layer 54 is produced by means of a thermal oxidation with a thickness that may be less than 10 nanometers. Afterward, using a low to medium acceleration voltage, the source region 22 or S is highly doped with the aid of an implantation.

The implantation is followed by the deposition of an electrically insulating spacer layer 56 having a thickness which is higher than the height H of the fin 12 plus the thickness of the hard mask 52. By way of example, the spacer layer 56 is a silicon dioxide layer having an original thickness of 140 nanometers. The spacer layer 56 is planarized, with the aid of a chemical mechanical polishing method, stopping on the hard mask 52 or on the residues of the hard mask layer 50 at CMP auxiliary structures (not shown).

After the planarization, the spacer layer 56 is etched back over the whole area to its target thickness, for example to 30 nanometers or to a thickness in the range of 30 nanometers to 50 nanometers. The etch is carried out in a time-controlled manner.

In the etched-back region, by means of an additional isotropic oxide etch in the exemplary embodiment, the thin screen oxide layer 54 is also removed from the vertical sidewalls of the etched structure. The side areas of the fin 12 are thus uncovered again.

A gate dielectric layer 58 is then deposited, by sputtering or vapor phase deposition CVD (Chemical Vapor Deposition). The gate dielectric layer 58 comprises oxynitride or some other high-k material. The oxide-equivalent thickness of the gate dielectric layer 58 is 1 nanometer in the exemplary embodiment. As an alternative, the thickness of the gate dielectric layer 58 lies in the range of 1 nanometer to 2 nanometers.

As is furthermore shown in FIG. 3A, a gate electrode layer 60 is subsequently applied, in particular deposited. The gate electrode layer 60 comprises a metal or highly doped polycrystalline silicon. At the end of application, the gate electrode layer 60 has a thickness that is greater than the distance in the direction of the normal N from the surface—remote from the substrate—of those regions of the gate dielectric layer 58 which do not lie on the hard mask 52 as far as the surface of the hard mask 52 that is removed from the substrate. A cutout between adjacent fins 12, including hard masks 52, are thus completely filled with the material of the gate electrode layer 58. In the exemplary embodiment, the gate electrode layer 60 is applied with a thickness of 110 nanometers.

After the application of the gate electrode layer 60, planarization is again effected, with the aid of a CMP method, stopping on the hard mask 52 or the part of the electrode layer which bears on the hard mask 52.

As shown in FIG. 3A, the planarized gate electrode layer 60 is then etched back over the whole area, in particular using an anisotropic etching method. Over the whole area means, in this case, that no mask is used for the patterning of the gate electrode layer 60 during the etching-back step. The time duration for the etching-back determines the remaining thickness of the gate electrode layer 60. In the exemplary embodiment, the gate electrode layer 60 has a remaining thickness of 20 nanometers after the etching-back. On account of the planarization preceding the etching-back, the etched-back gate electrode layer 60 has a uniform layer thickness. The gate electrode layer 60 is thus etched back to below the surface of the hard mask 52 that is remote from the substrate and also below the surface of the fin 12 that is remote from the substrate.

After the etching-back or else prior to the etching-back of the gate electrode layer 60, the gate electrode layer 60 and preferably also the spacer layer 56 may already be patterned by means of a lithographic method or by means of a spacer technique, in other words using a mask. As an alternative, however, the patterning of the gate electrode layer 60 and, if appropriate, also of the spacer layer 56 is carried out at a later point in time jointly with at least one layer applied after the application of the gate electrode layer 60. The gate electrode connection layer 16 arises during the patterning of the gate electrode layer 60.

As is furthermore shown in FIG. 3A, after the etching-back of the gate electrode layer 58, a second electrically insulating spacer layer 62 is applied, by means of a deposition. In the exemplary embodiment, the second spacer layer 62 comprises the same material as the spacer layer 56 that is nearer to the substrate 13. As an alternative, however, the spacer layers 56 and 62 comprise mutually different materials.

The spacer layer 62 is applied with a thickness that is greater than the difference in height between the substrate-remote surface of the hard mask 52 or the substrate-remote surface of the gate dielectric layer 58 that has remained on the hard mask and the substrate-remote surface of the etched-back gate electrode layer 60. In the exemplary embodiment, the thickness of the spacer layer is 90 nanometers directly after application.

The spacer layer 62 is subsequently etched back over the whole area to a target thickness of e.g. 30 nanometers, so that the surface of the spacer layer 62 that is remote from the substrate and lies approximately 10 nanometers below the free end of the fin 12.

In a further method step, as illustrated in FIG. 3B, the uncovered gate dielectric 58 is removed, dry-chemically or wet-chemically, from the areas of the fin 12 that have not yet been covered and from the hard mask 52. A connection region for making contact with the drain region is thus uncovered at the free end of the fin 12. Optionally, the residual hard mask 52 is also removed wet-chemically.

A drain contact material 64 is subsequently deposited, preferably with a thickness that is greater than the residual difference in height by which the fin 12 or by which the hard mask 52 projects above the spacer layer 62. The drain contact material 64 is highly doped polycrystalline silicon. Optionally, the drain contact material 64 is then planarized and etched back over the whole area.

The drain contact material 64 is subsequently patterned by means of a lithography method. Steps for producing metal contacts optionally follow. During the deposition of the drain contact material 64 or during subsequent thermal steps, dopant diffuses from the drain layer 64 into the fin 12 in order to form the drain zone. At the same time, dopant diffuses from the source region into the lower region of the fin in order to form the source connection to the channel. The drain region 20 arises from the drain contact material 64 during patterning.

FIG. 4 shows an alternative production stage in the production of the field effect transistor 10. Instead of the deposition of a gate dielectric layer 58, after the spacer layer 56 has been etched back, a gate dielectric 70 is only applied on the uncovered sidewalls of the fin 12, in particular by means of a thermal oxidation. As an alternative, an oxynitride layer is only produced on the sidewalls of the fin 12. The same production steps as have been explained with reference to FIGS. 3A and 3B are then performed.

Figure 5B:
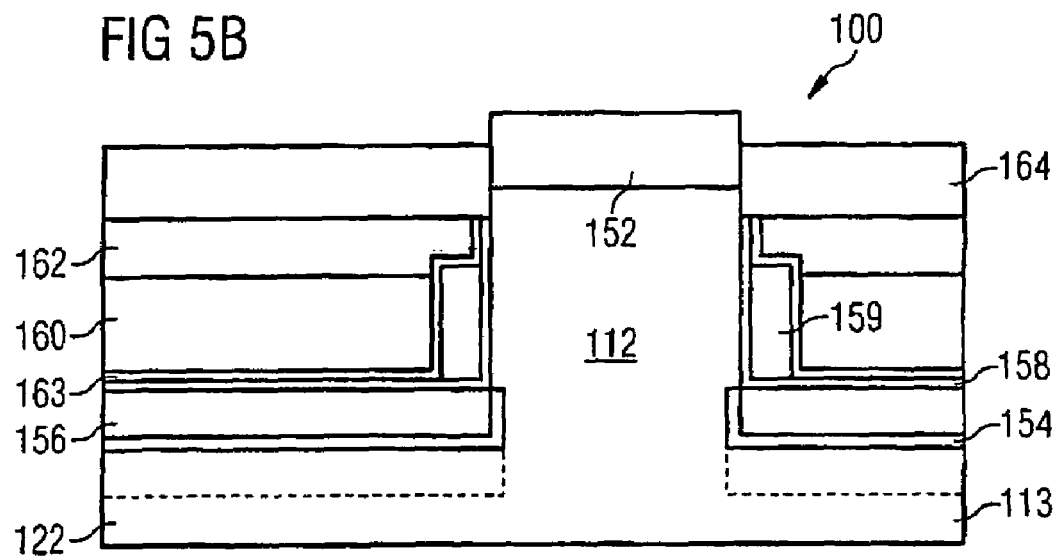

FIGS. 5A and 5B show production stages in the production of a vertical sidewall flash field effect transistor 100. The production of the transistor 100 proceeds as in the production of the transistor 10 or the alternatives mentioned e.g. apart from the additional method steps for producing a charge storage layer or a so-called floating gate which are explained below.

In particular, the following method steps are again performed in the order mentioned below. Proceeding from a substrate 113, a fin 112 having the same dimensions as the fin 12 is produced by means of a hard mask 152 or by means of some other technique. Next, a thin screen oxide layer 154 is applied. Afterwards, source regions 122 are implanted. Therefore, an electrically insulating planar spacer layer 156 is produced preferably by deposition, planarization and whole-area etching-back. Finally, a first gate dielectric layer 158 is produced by whole-area deposition like the gate dielectric layer 58. As an alternative, a gate dielectric corresponding to the gate dielectric 70 is produced only on the fin 112.

As shown in FIG. 5A, steps for producing a charge storage region 159 are carried out after the production of the first gate dielectric. For this purpose, a highly doped polycrystalline silicon layer is deposited. As an alternative, a dielectric material or a metal may also serve as material for the charge storage region. The layer for producing the charge storage region 159 is deposited with a thickness which enables subsequent complete planarization. By way of example, the layer thickness is 110 nanometers after application.

The material for producing the charge storage region 159 is subsequently planarized, by means of CMP, CMP stop structures preferably serving as a stop. This is followed by whole-area etching-back, the remaining thickness of the layer for forming the charge storage region 159 being 30 nanometers remaining.

As is furthermore shown in FIG. 5A, a spacer element 161 or a spacer is subsequently produced by means of a layer deposition and anisotropic etching, which spacer element or spacer, on the sidewalls covered with the gate dielectric, encloses the fin 112 and, if appropriate, the sidewalls of the hard mask 152 that are covered with gate dielectric. The spacer element 161 bears on the layer for forming the charge storage region.

The layer for forming the charge storage region 159 is subsequently patterned with the aid of the spacer element 161 as a hard mask in an anisotropic etching process. The spacer element 161 is then removed. The hard mask 152 still remains on the fin 112 in the exemplary embodiment.

As is shown in FIG. 5B, a further dielectric layer 163 is then produced. The same method steps as for producing the transistor 10 are subsequently carried out as described below.

First, production of an electrically conductive gate electrode layer 160, made of highly doped polycrystalline silicon, by deposition, planarization and whole-area etching-back is executed. The thickness and the material of the gate electrode layer 160 are the same as the thickness and the material of the gate electrode layer 60. In the exemplary embodiment, the gate electrode layer 160 has been etched back further than the charge storage region 159. As an alternative, however, the gate electrode layer 160 is etched back to a lesser extent, so that it overlaps the charge storage region 159.

Production of a further electrically insulating spacer layer 162, which is or may be the same as the spacer layer 62 in terms of its thickness and in terms of its material. However, it is also possible to use other materials or some other thickness of the spacer layer. Afterwards, the gate electrode layer 160 and of the spacer layer 162 is patterned by means of a photolithographic method. Next, the two gate dielectrics above the spacer layer 162, are eliminated and then the residual hard mask 152 may be optionally removed. Therefore, application of drain contact material 164, which corresponds to the drain contact material 64, preferably by deposition, planarization and whole-area etching-back, as a result of which the drain-gate capacitance decreases is executed. Finally, the drain contact material 164 is patterned.

The flash cell is preferably programmed by means of "hot" charge carriers, which are also referred to as CHE or channel hot electrons. Fowler-Nordheim tunneling currents are preferably used for erasure. The flash cells are organized in accordance with the known NOR structure. This means that the source connections are patterned as bit lines in a bit line direction. Word lines produced by patterning of the gate electrodes run at right angles to the bit lines. A multiplicity of memory transistors of a memory cell array constructed in matrix-type fashion are situated on each bit line and word line, respectively.

In other exemplary embodiments, no hard mask 52, 152 is used, or the hard mask 52, 152 is removed early, so that the end of the fin 12 or 112 serves as a reference point for the thickness of the layers to be planarized.

By account of the buried source regions 122, the transistor 100 requires only a small substrate area. Moreover, the four gate regions enable a large switch-on current, so that a reduced operating voltage of e.g. less than 3 volts can be utilized. The production methods specified are simple and enable transistors to be produced reproducibly within very narrow tolerances.

As a person skilled in the art will readily appreciate, the above description is meant as an illustration of implementation of the principles this invention. This description is not intended to limit the scope or application of this invention in that the invention is susceptible to modification, variation and change, without departing from spirit of this invention, as defined in the following claims.

The invention claimed is:

1. A method for producing a vertical field effect transistor comprising the following steps:
    forming of at least one structure on a substrate which serves for forming the channel region of a field effect transistor;
    applying an electrically insulating spacer layer near to the substrate after the formation of the structure;
    applying an electrically conductive or semiconducting control electrode layer which serves for forming the control electrode of the field effect transistor;
    planarization of the control electrode layer;
    whole-area etching-back of the planarized control electrode layer; and prior to applying the control layer electrode, the steps of:
    planarizing the spacer layer near to the substrate; and
    whole-area etching-back of the spacer layer near to the substrate.

2. The method of claim 1, further comprising uncovering during the etching-back of the planarized control electrode layer a part of the structure or a part of an insulating layer covering the structure.

3. A method for producing a vertical field effect transistor comprising the following steps:
    forming of at least one structure on a substrate which serves for forming the channel region of a field effect transistor;
    applying an electrically insulating spacer layer near to the substrate after the formation of the structure;
    applying an electrically conductive or semiconducting control electrode layer which serves for forming the control electrode of the field effect transistor;
    planarization of the control electrode layer;
    whole-area etching-back of the planarized control electrode layer; and
    applying an electrically insulating spacer layer remote from the substrate after the etching-back of the control electrode layer;
    planarizing the spacer layer remote from the substrate; and
    whole-area etching-back of the spacer layer remote from the substrate.

4. The method of claim 3, further comprising, after the application of the spacer layer remote from the substrate, the steps of:
    applying a connection electrode layer serving for forming a connection electrode of the field effect transistor; and
    planarizing the connection electrode layer.

5. The method of claim 4, further comprising joint patterning of the control electrode layer and of the spacer layer remote from the substrate.

6. A method for producing a vertical field effect transistor comprising the following steps:
    forming of at least one structure on a substrate which serves for forming the channel region of a field effect transistor;
    applying an electrically insulating spacer layer near to the substrate after the formation of the structure;
    applying an electrically conductive or semiconducting control electrode layer which serves for forming the control electrode of the field effect transistor;
    planarization of the control electrode layer;
    whole-area etching-back of the planarized control electrode layer; and
    forming an electrically insulating layer on a part of the structure near the substrate after the etching-back of the spacer layer and prior to the application of the control electrode layer.

7. The method of claim 6, wherein the electrically insulating layer is produced by whole-area layer deposition or by thermal growth.

8. The method of claim 1, further comprising forming the structure with the aid of a hard mask.

9. A method for producing a vertical field effect transistor comprising the following steps:
    forming of at least one structure on a substrate which serves for forming the channel region of a field effect transistor;
    applying an electrically insulating spacer layer near to the substrate after the formation of the structure;
    applying an electrically conductive or semiconducting control electrode layer which serves for forming the control electrode of the field effect transistor;
    planarization of the control electrode layer;
    whole-area etching-back of the planarized control electrode layer; and
    applying a charge storage layer near to the substrate after the application of the spacer layer and prior to the application of the control electrode layer;
    patterning the charge storage layer prior to the application of the control electrode layer.

10. The method of claim 9, further comprising:
    planarizing the charge storage layer;
    whole-area etching-back of the charge storage layer;
    forming at least one spacer element on the structure,
    patterning the charge storage layer using the spacer element.

* * * * *